US006940768B2

(12) United States Patent
Dahlberg et al.

(10) Patent No.: US 6,940,768 B2
(45) Date of Patent: Sep. 6, 2005

(54) PROGRAMMABLE DATA STROBE OFFSET WITH DLL FOR DOUBLE DATA RATE (DDR) RAM MEMORY

(75) Inventors: James A. Dahlberg, Eagan, MN (US); Obed Duardo, Coral Springs, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/699,932

(22) Filed: Nov. 4, 2003

(65) Prior Publication Data

US 2005/0105349 A1 May 19, 2005

(51) Int. Cl.[7] ................................................ G11C 7/00
(52) U.S. Cl. ....................... 365/201; 365/194; 365/233
(58) Field of Search ................................ 365/201, 194, 365/233, 189.07

(56) References Cited

U.S. PATENT DOCUMENTS 6,286,077 B1 9/2001 Choi et al.
6,327,217 B1 * 12/2001 Chung ........................ 365/233
6,330,636 B1 12/2001 Bondurant et al.
6,373,301 B1 4/2002 Chen et al.
6,426,900 B1 7/2002 Maruyama et al.
6,438,067 B2 8/2002 Kuge et al.
6,438,670 B1 8/2002 McClannahan
6,442,102 B1 8/2002 Borkenhagen et al.
6,453,381 B1 9/2002 Yuan et al.
6,484,232 B2 11/2002 Olarig et al.
6,487,648 B1 11/2002 Hassoun
6,529,424 B2 3/2003 Koutsoures
6,553,452 B2 4/2003 Garlepp et al.
6,553,472 B2 4/2003 Yang et al.
6,556,489 B2 4/2003 Gomm et al.
6,563,747 B2 5/2003 Faue
6,570,815 B2 5/2003 Kashiwazaki
6,581,017 B2 6/2003 Zumkehr
6,584,578 B1 6/2003 Faue
2001/0054135 A1 12/2001 Matsuda
2002/0013881 A1 1/2002 Delp et al.
2002/0172079 A1 11/2002 Hargis et al.
2002/0178322 A1 11/2002 Gans et al.
2003/0001650 A1 1/2003 Cao et al.
2003/0005250 A1 1/2003 Johnson et al.
2003/0011414 A1 1/2003 Bell
2003/0070052 A1 4/2003 Lai
2003/0076712 A1 4/2003 Jang

* cited by examiner

*Primary Examiner*—David Lam

(57) ABSTRACT

A double data rate (DDR) synchronous dynamic RAM (SDRAM), or DDR-SDRAM, memory controller employing a delay locked loop (DLL) circuit to delay an SDRAM data strobe (DQS) signal to the center, or 'eye' of the read data window. However, in distinction from conventional techniques, the initial delay determined by the DLL is fine tuned with an offset determined by a memory test. Moreover, in an additional embodiment, the delay may be further adjusted during operation to compensate for environmental conditions by a PVT (process, value, temperature) circuit.

21 Claims, 3 Drawing Sheets

PROGRAMMABLE DATA STROBE OFFSET WITH DLL FOR DOUBLE DATA RATE (DDR) RAM MEMORY

BACKGROUND OF THE INVENTION

1. Field of the Invention

This invention relates to semiconductor circuits. More particularly, it relates to circuitry used to access data in a memory device.

2. Background of Related Art

The basic principle of Double Data Rate (DDR) Synchronous Dynamic Random Access Memory (SDRAM), or DDR-SDRAM, is very simple. DDR-SDRAM is RAM that transfers data on both 0-1 and 1-0 clock transitions, theoretically yielding twice the data transfer rate of normal SDRAM. Thus, while a DDR-SDRAM memory module is clocked at the same speed as normal SDRAM, it is able to transport double the amount of data by using the rising as well as falling edge of the clock signal for data transfers.

During any data access, a controller provides the DDR SDRAM with a clock, inverted clock, address, and control signals. During a write cycle, the controller also provides data as well as a data strobe signal (DQS). During a read cycle, the DDR-SDRAM provides data and the DQS signal. Accordingly, the DQS signal is bi-directional because it is used to clock data into the DDR-SDRAM during a write cycle, and the other direction into the controller during a read cycle. Bank pre-charging, refreshes, and so forth are handled in a DDR-SDRAM controller in much the same way they are handled in a standard SDRAM.

The DDR-SDRAM specification requires that the clock and inverted clock received from the controller cross within a very tight window. The crossing point of these clocks is considered the clock edge in the DDR SDRAM specification.

To maximize setup and hold time windows, the controller must drive DQS 90° out of phase with the data. Data is clocked by the DDR SDRAM on both edges of DQS. During a read, the DDR SDRAM provides both data and DQS. However, the DDR SDRAM provides data and DQS coincident with each other. This means the controller must either provide the 90° phase shift internally or find another way to clock in data. In addition, DQS is a strobed signal. It is driven while there is a transaction in progress, but tri-stated otherwise.

To achieve the ideal 90° phase shift, one of the most difficult issues addressed in the design of a Double Data Rate (DDR) SDRAM controller is delaying the SDRAM data strobe (DQS) to the center of the read window.

In conventional Double Data Rate (DDR) SDRAM controllers, it is common design practice to use Delay Locked Loops (DLLs) to implement a fixed, predetermined delay of the SDRAM read data strobe (DQS) to the approximate center of the received data eye. However, this use of DLLs providing a fixed amount of DQS delay is seen by the inventors of the present invention to have particular disadvantages. In particular, this delay is usually based on a calculated optimal value, which may not, in practice, be the optimal value.

At the Double Data Rate (DDR) SDRAM side, all data and data strobes (DQS) are clocked out by the same clock signal provided by the DDR SDRAM controller, and all will transit at nominally the same time. To capture the data from the DDR, the controller must delay the received DQS strobes so that the strobe transition occurs as close as possible to the center of the received data window, or "eye".

To design a robust data capture circuit, several factors are taken into account including, e.g., DDR timing parameters, as well as board level and package skews. Typically, a DDR SDRAM controller is implemented in an FPGA or ASIC, in which case internal routing mismatches and PVT (Process, Voltage, and Temperature) for the controller device must also be considered. This is all well documented in literature available from DDR manufacturers such as the "DesignLine", Vol. 8, Issue 3, 3Q99, available from MICRON™. The final result of this analysis results in a fixed DQS delay value ($DLY_{DQS}$) which a DLL is used to implement.

FIG. 3 shows an exemplary conventional DDR read data capture circuit using a DLL circuit to implement a fixed DQS delay.

In particular, the conventional DDR read data capture circuit shown in FIG. 3 uses n+1 identical programmable delay lines 302*a*–302*d*, 310. The master "Programmable Delay 1" 302*a* through "Programmable Delay n" 302*d* are used to implement the programmable delay portion of a delay locked loop (DLL) 300. When the DLL 300 reaches lock, the total delay through these n delay lines 302*a*–302*d* is equal to one (1) clock period ($t_{CLK}$) of the clock signal CLK. Since all the programmable delays 302*a*–302*d*, 310 are identical, the delay through each individual programmable delay element 302*a*–302*d*, 310 is equal to the clock period divided by n ($t_{CLK}/n$). To delay DQS to the pre-calculated center of the data eye, the value of n is conventionally chosen such that $t_{CLK}/n=DLY_{DQS}$. A slave programmable delay line 310 is then used to implement the delay of DQS. Since the slave programmable delay line 310 is identical to the master programmable delay lines 302*a*–302*d*, DQS will be delayed by $t_{CLK}/n$.

One of the disadvantages of such a conventional SDRAM controller is that it relies on dividing a clock period by a value, n, to obtain a desired delay. Since n must be an integer value, and the clock is usually the clock provided to the DDR SDRAMs, it is realized by the inventors of the present application that the resulting delay value will probably not be exactly equal to the actual, optimal delay value.

There is a need for better techniques and designs for centering DQS data strobes based on actual, optimal values.

SUMMARY OF THE INVENTION

In accordance with the principles of the present invention, a method of providing an optimal memory access strobe comprises determining an initial delay for a data access signal to a memory device by employing a delay locked loop (DLL) circuit to delay the data access signal to a center of a data window. A memory test of the memory device is performed, and the initial delay is adjusted by a fine tuning offset determined by the memory test.

In accordance with another aspect of the present invention, a DQS strobe controller for a double data rate (DDR) memory device comprises a delay line formed by a plurality of programmable delay elements to provide an initial delay. An adder/subtracter element implements a fine tuning adjustment of the initial delay. The fine tuning adjustment is determined empirically by operation of the DQS strobe controller in operation with the DDR memory device.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

Conventional DQS data strobes are centered based on fixed, predetermined designs. The present invention improves upon conventional DQS data strobes by providing a technique for tweaking the DQS data strobe delay resulting in a more exact, actual center of a received data eye. In an additional embodiment, the present invention also adds compensation for actual on-chip delay changes due to voltage and/or temperature fluctuations.

Thus, the present invention provides a DDR SDRAM controller that determines and locks-in on the actual center of the DDR SDRAM received (read) data window, or "eye". While disclosed with respect to a DDR-DRAM in particular, the invention relates as well to DDR-RAM in general, or even to any memory controller that captures data from a source that also provides the capture clock or strobe.

Accordingly, the present invention provides better centering of DQS data strobes by integrating a fine adjustment, or "tweaking", of a DQS delay via a programmable offset value to be added to or subtracted from a nominal value determined by a DLL. Moreover, in a further embodiment, a PVT circuit may be also (or alternatively) be implemented to maintain the data strobe in an actual centered position by automatically compensating for fluctuations in voltage and temperature.

To accomplish this, the present invention provides a double data rate (DDR) synchronous dynamic RAM (SDRAM) memory controller employing a delay locked loop (DLL) circuit to delay an SDRAM data strobe (DQS) signal to the center, or 'eye' of the read data window. However, in distinction from conventional techniques, the initial delay determined by the DLL is importantly also fine tuned with an offset empirically determined, e.g., by a memory test. Moreover, in an additional embodiment, the delay may be further adjusted during operation to compensate for environmental conditions by a PVT (process, value, temperature) circuit.

Figure 1:
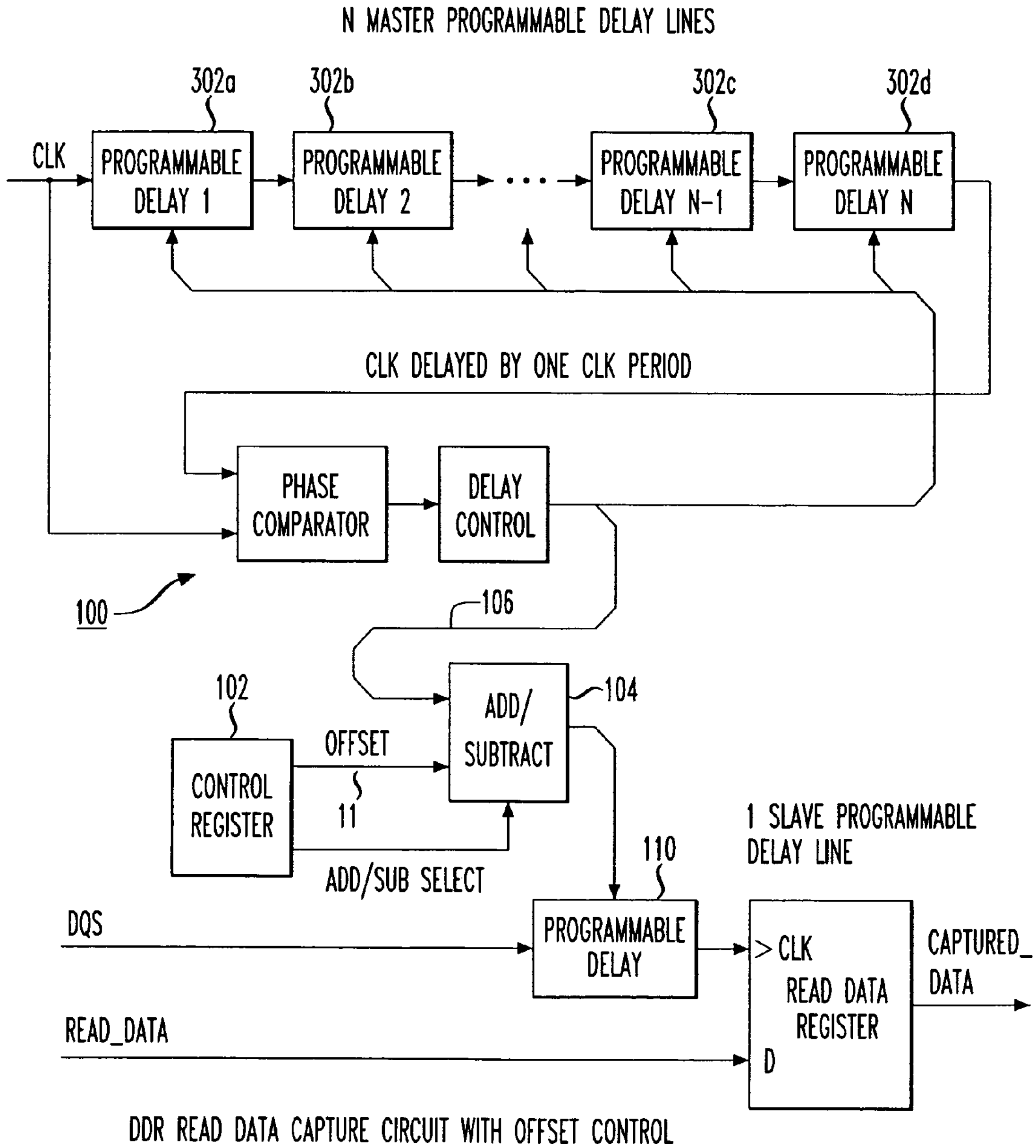
FIG. 1 shows a DDR read data capture circuit with offset control, in accordance with the principles of the present invention.

FIG. 1 shows an improved DDR read data capture circuit including offset control, in accordance with the principles of the present invention.

In particular, as shown in FIG. 1, a control register 102 and an add/subtract unit 104 are added to an otherwise conventional DDR read data capture circuit to allow modifying (tweaking) of the delay value selected by the DLL 100.

The disclosed control register 102 provides an offset value and a bit that controls whether the offset value is added to or subtracted from the delay value 106 determined by the DLL 100. With these modifications, an additional controller (hardware or software, not shown) may be added to run a memory test while adding and subtracting various offsets 11 to determine the limits of failure free operation. The final offset 11 to be used in normal operation is preferably the one in the middle of the limits in which the memory test passes.

This embodiment of the invention utilizes a control register 102 that can be written, to determine the overall DQS delay limits for failure free memory operation. Preferably, the memory test is implemented in software. However, a memory test may be implemented in hardware within the principles of the present invention.

One important advantage provided by this embodiment of the present invention is that the data strobe (DQS) delay can be tweaked by the addition or subtraction of a fine adjustment offset 11, to allow it to be positioned closer to the actual, optimal center of the data eye. This results in more reliable memory operations, as well as a higher frequency of operation.

Figure 2:
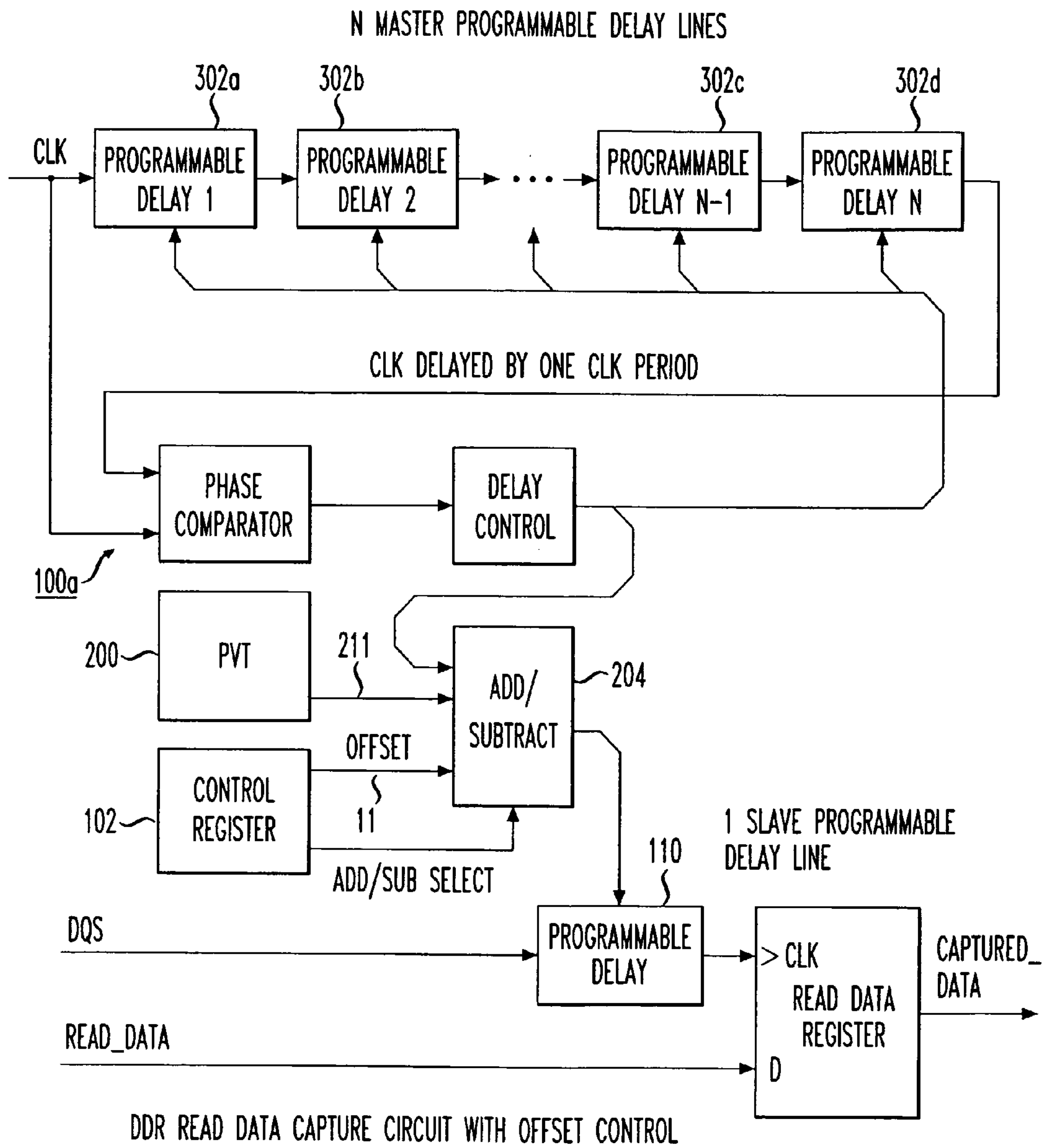
FIG. 2 shows another embodiment of the present invention wherein a DDR read data capture circuit includes PVT offset control, in accordance with another aspect of the present invention.
Figure 3:
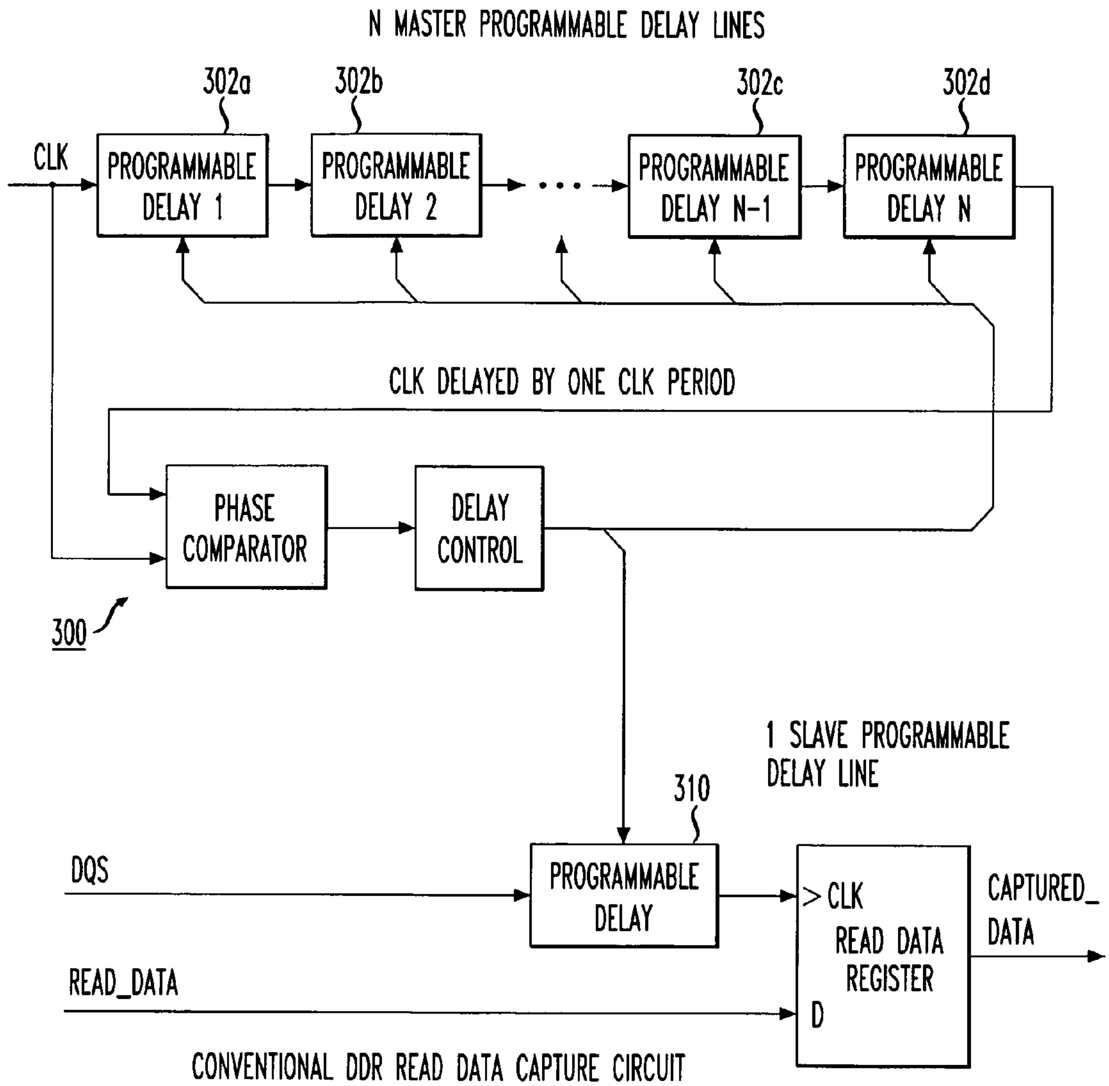
FIG. 3 shows an exemplary conventional DDR read data capture circuit using a DLL circuit to implement a fixed DQS delay.

FIG. 2 shows another embodiment of the present invention wherein a DDR read data capture circuit includes PVT offset control, in accordance with another aspect of the present invention.

In particular, FIG. 2 shows a modification to the circuit shown in FIG. 1 wherein a PVT circuit 200 is added to compensate for changes in the tweaked delay value providing offset 11 due to fluctuations in voltage and temperature. PVT circuits are known, and provide information about the operating conditions (process, voltage, and temperature) of a device in a system. The PVT circuit 200 outputs another fine adjustment offset output value 211 that indicates the current operating conditions of the device. The PVT fine adjustment offset output value 211 will vary as the actual voltage and/or temperature changes. The PVT fine adjustment offset output value 211 is also affected by actual variations in the device process manufacturing, which can be considered a constant for any given instance of a device. As applied to the present invention, the PVT circuit 200 corrects the offset delay 11 provided by the DLL 100*a*, and the offset 11 provided by the control register 102, keeping the overall actual delay offset relatively constant as the voltage and/or temperature of the DDR read data capture circuit actually varies over time.

Thus, the addition of a PVT circuit 200 as shown in FIG. 2 provides automatic strobe delay compensation for fluctuations due to voltage and temperature. An advantage of this particular embodiment of the present invention is that it allows for a highly refined data strobe (DOS) delay that is automatically maintained at an actual, optimal value, even through fluctuations in voltage and/or temperature. This results in more reliable memory operations and/or a higher frequency of operation.

U.S. Pat. No. 6,581,017 to Zumkehr shows a conventional technique for providing a DOS strobe signal to a DDR-DRAM. In particular, Zumkehr teaches master and slave strobe delay devices each incorporating a separate PVT circuit. In the Zumkehr patent, the slave delays MUST initially be calibrated by software (or suitable hardware) after power-up. Thereafter, the master "PVT" circuit is used to incrementally adjust the slave circuits' delays.

The present invention differs significantly in that a master delay circuit is not a PVT circuit, but rather is a delay locked loop (DLL). The inventive DLL 100*a* performs most of the calibration that conventional methods such as is taught by Zumkehr requires significant amounts of software and/or hardware to accomplish. The present invention also utilizes software (or a hardware equivalent) to write to a control register 102 to "tweak" or fine tune the delay determined by the DLL 100*a* and provide additional accuracy and/or reliability.

Furthermore, to provide continued reliability, the inventive solution utilizes a separate PVT circuit 200 to fine tune the delays determined by the DLL 100_a_, as adjusted on the whole by a master PVT circuit 200.

Also, the delay circuits 302_a_–302_d_ in accordance with the principles of the present invention are preferably only simple programmable delay circuits. They rely completely on the DLL 100_a_, and tweaking circuitry 200, 102, 204 to determine the amount of their actual delay. In contrast, conventional circuits such as that taught by Zumkehr require slave delay circuits to each incorporate an oscillator and frequency counter circuitry.

U.S. Pat. Appl. Publ. No. 2002/0013881 to Delp et al. describes a method to provide programmable clock delays between memory control signals such as RAS, CAS, Enable, etc. Delp fails to address anything about how to delay a memory data strobe (DQS) to line up with memory data.

U.S. Pat. Appl. Publ. No. 2003/005250 to Johnson et al. discloses a DLL that provides N phases of an input clock signal (RCLK), and programmable phase command registers to select one of N phases. Johnson uses this circuitry to synchronize read data outputs with an input clock. However, Johnson fails to provide a slave delay line 100_a_ with programmable "tweaking" or fine tuning to delay a separate clock signal (like DQS) based on actual optimal parameters, nor does Johnson provide a PVT circuit 200, as implemented in various embodiments in accordance with the principles of the present invention.

U.S. Pat. Appl. Publ. No. 2003/0001650 to Cao et al. describes a conventional PVT circuit and how it may be used to preset a shift register used in the implementation of a DLL.

U.S. Pat. No. 6,484,232 to Olarig et al. describes a method to adjust memory controller calibration frequencies based on temperature and other environmental conditions. Olarig fails to address anything to do with fine tuning adjustment of delay line values based on a programmable offset and/or on a PVT circuit, as does the present invention.

While the invention has been described with reference to the exemplary embodiments thereof, those skilled in the art will be able to make various modifications to the described embodiments of the invention without departing from the true spirit and scope of the invention.

What is claimed is:

1. A method of providing an optimal memory access strobe, comprising:

determining an initial delay for a data access signal to a memory device by employing a delay locked loop (DLL) circuit to delay said data access signal to a center of a data window;

performing a memory test of said memory device; and adjusting said initial delay by a fine tuning offset determined by said memory test.

2. The method of providing an optimal memory access strobe according to claim 1, wherein:

said data access signal is a DQS strobe.

3. The method of providing an optimal memory access strobe according to claim 1, wherein:

said data access signal is a read data access clock signal.

4. The method of providing an optimal memory access strobe according to claim 1, wherein:

said data access signal is a write data access clock signal.

5. The method of providing an optimal memory access strobe according to claim 4, wherein:

said DQS strobe relates to a DDR-RAM device.

6. The method of providing an optimal memory access strobe according to claim 5, wherein:

said DQS strobe relates to a DDR-SDRAM device.

7. The method of providing an optimal memory access strobe according to claim 1, wherein:

said data window is a read data window.

8. The method of providing an optimal memory access strobe according to claim 1, wherein:

said data window is a write data window.

9. The method of providing an optimal memory access strobe according to claim 1, further comprising:

further adjusting said initial delay in correlation to actual environmental conditions using a PVT circuit.

10. Apparatus for providing an optimal memory access strobe, comprising:

means for determining an initial delay for a data access signal to a memory device by employing a delay locked loop (DLL) circuit to delay said data access signal to a center of a data window;

means for performing a memory test of said memory device; and means for adjusting said initial delay by a fine tuning offset determined by said memory test.

11. The apparatus for providing an optimal memory access strobe according to claim 10, wherein:

said data access signal is a DQS strobe.

12. The apparatus for providing an optimal memory access strobe according to claim 11, wherein:

said DQS strobe relates to a DDR-RAM device.

13. The apparatus for providing an optimal memory access strobe according to claim 12, wherein:

said DQS strobe relates to a DDR-SDRAM device.

14. The apparatus for providing an optimal memory access strobe according to claim 10, wherein:

said data access signal is a read data access clock signal.

15. The apparatus for providing an optimal memory access strobe according to claim 10, wherein:

said data access signal is a write data access clock signal.

16. The apparatus for providing an optimal memory access strobe according to claim 10, wherein:

said data window is a read data window.

17. The apparatus for providing an optimal memory access strobe according to claim 10, wherein:

said data window is a write data window.

18. The apparatus for providing an optimal memory access strobe according to claim 10, further comprising:

PVT adjustment circuit means for further adjusting said initial delay in correlation to actual environmental conditions.

19. A DQS strobe controller for a double data rate (DDR) memory device, comprising:

a delay line formed by a plurality of programmable delay elements to provide an initial delay; and an adder/subtracter element for implementing a fine tuning adjustment of said initial delay, said fine tuning adjustment being determined empirically by operation of said DQS strobe controller in operation with said DDR memory device.

20. The DQS strobe controller for a double data rate (DDR) memory device according to claim 19, further comprising:

a PVT circuit to provide an additional fine tuning adjustment of said initial delay.

21. The DQS strobe controller for a double data rate (DDR) memory device according to claim 19, wherein:

said fine tuning adjustment is determined empirically by way of a memory test of said actual DDR memory device.

* * * * *